(12) United States Patent
Gu et al.

(10) Patent No.: US 6,797,456 B1
(45) Date of Patent: Sep. 28, 2004

(54) DUAL-LAYER DEEP ULTRAVIOLET PHOTORESIST PROCESS AND STRUCTURE

(75) Inventors: Yiming Gu, Hillsboro, OR (US); John L. Sturtevant, Beaverton, OR (US); Anging Zhang, Cupertino, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 62 days.

(21) Appl. No.: 10/211,493

(22) Filed: Aug. 1, 2002

(51) Int. Cl.$^7$ ............................................... G03F 7/00
(52) U.S. Cl. .................... 430/312; 430/322; 430/270.1
(58) Field of Search ............................... 430/312, 322, 430/270.1

(56) References Cited

U.S. PATENT DOCUMENTS

| | | | |
|---|---|---|---|
| 6,107,006 A | * | 8/2000 | Chang ........................ 430/322 |
| 6,165,855 A | | 12/2000 | Besser et al. |
| 6,641,971 B2 | * | 11/2003 | Huang et al. ............. 430/270.1 |
| 2001/0053486 A1 | * | 12/2001 | Matsunuma .................... 430/5 |

OTHER PUBLICATIONS

Substrate Contamination Effects in the Processing of Chemically Amplified DUV Photoresists, J. Sturtevant et al., Proc. SPIE, 2197(1995) pp. 770–780.

Chemically Amplified Photoresists: Past, Present, and Future, H. Ito, Proc. SPIE, 3678 (1999) pp. 2–12.

Intrinsic DUV Resist Properties and Their Application to the Development of Advanced Integrated Circuits, Micro Eng., 41/42 (1998) p. 37–45.

Optimizing a DUV Positive Resist for Metal Layers, S. Malik et al., Proc. SPIE, 3678 (1999) p. 527–535.

Characterization and Optimization of positive tone DUV Resists on TiN Subsdtrates, P. Zandbergen et al., Proc SPIE 3049 (1995) p. 314–323.

\* cited by examiner

*Primary Examiner*—M. Angebranndt
*Assistant Examiner*—Kripa Sagar
(74) *Attorney, Agent, or Firm*—Glass & Associates; Kenneth Glass

(57) ABSTRACT

A method for forming a photoresist structure that does not have swelling defects. A layer of low activation energy deep ultraviolet photoresist is disposed over a layer that is to be patterned. A layer of high activation energy deep ultraviolet photoresist is then deposited such that the layer of high activation energy photoresist directly overlies the layer of low activation energy photoresist. The two photoresist layers are then processed by performing exposure, post-exposure bake, and development steps to form a photoresist structure. An etch step is then performed so as to form a patterned layer that does not have swelling defects.

11 Claims, 6 Drawing Sheets ial layer of low activation
DUAL-LAYER DEEP ULTRAVIOLET PHOTORESIST PROCESS AND STRUCTURE

FIELD OF THE INVENTION

The present invention relates to the field of semiconductor devices. More specifically, the present invention relates to an apparatus and method for eliminating substrate contamination defects in semiconductor devices.

BACKGROUND ART

High activation energy deep ultraviolet photoresists have high etch selectivity and low proximity bias. In addition, high activation energy deep ultraviolet photoresists have low degassing and long shelf life. The high etch selectivity and low proximity bias of high activation energy deep ultraviolet photoresists makes them particularly desirable for patterning small dense structures such as the metal local-interconnect layer, which can have a minimum dimension similar to that of poly-gate structures.

However, high activation energy deep ultraviolet photoresists have poor environmental stability. More particularly, deprotecton of high activation energy deep ultraviolet photoresists occurs at the post-exposure bake step. Because there is a time gap between exposure and the post-exposure bake step, airborne base and basic substrate species enter into the photoresist film. These substrate species neutralize acid and stop deprotection. This results in substrate contamination defects in the photoresist film.

In one prior art photolithographic processes, an anti-reflective coating is used in conjunction with an overlying silicon dioxide barrier layer. The silicon dioxide barrier layer is effective for reducing photoresist footing and scumming. However, the silicon dioxide barrier layer does not eliminate footing and scumming. In addition, the silicon dioxide barrier layer is not effective for preventing all substrate contamination defects, such as localized resist swelling defects.

Swelling defects are areas within the photoresist film where features have "swelled," or uniformly increased in size. Footing and scumming defects tend to occur in a widespread fashion across the entire substrate. However, swelling defects are highly localized substrate contamination defects that typically occur over contact plugs. For example, when high activation energy photoresist is used to pattern a metal local-interconnect layer, swelling defects commonly occur where the photoresist overlies an interconnect. This swelling can cause bridging of adjacent photoresist features. This can result in bridging of features in the metal local-interconnect layer, resulting in reduced yield and increased manufacturing cost.

Thus, there is a need for a photoresist structure and a method for forming a photoresist structure that does not have swelling defects. In addition, there is a need for a patterned metal layer and a method for forming a patterned metal layer that does not have swelling defects. In addition, there is a need for a method and apparatus that meets the above needs and that reduces footing-related defects and scumming-related defects. The present invention meets the above needs.

DISCLOSURE OF THE INVENTION

The present invention provides a photoresist structure and a method for forming a photoresist structure that does not have swelling defects. In addition, the present invention provides a patterned metal layer and a method for forming a patterned metal layer that does not have swelling defects. Also, the method and apparatus of the present invention reduces footing-related defects and scumming-related defects. By eliminating swelling defects and reducing footing-related defects and scumming-related defects, manufacturing yield is improved and manufacturing costs are reduced.

A method for forming a photoresist structure on a semiconductor substrate is disclosed. A layer of low activation energy photoresist is disposed over a substrate that is to be patterned. A layer of high activation energy photoresist is then deposited such that the layer of high activation energy photoresist directly overlies the layer of low activation energy photoresist.

An exposure step is performed, followed by a heating step (post-exposure bake) and a developing step. The low activation energy photoresist acts as a substrate contamination barrier, protecting the overlying high activation energy photoresist layer. This results in a photoresist structure that does not have swelling defects where the photoresist structure overlies interconnects. In addition, the photoresist structure has reduced footing and scumming.

Because the photoresist structure does not have swelling defects, the subsequent etch step results in a patterned substrate that does not have swelling defects. In addition, the patterned substrate has reduced footing-related defects and reduced scumming-related defects. Accordingly, manufacturing yield is improved and manufacturing costs are reduced.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present Invention. However, It will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
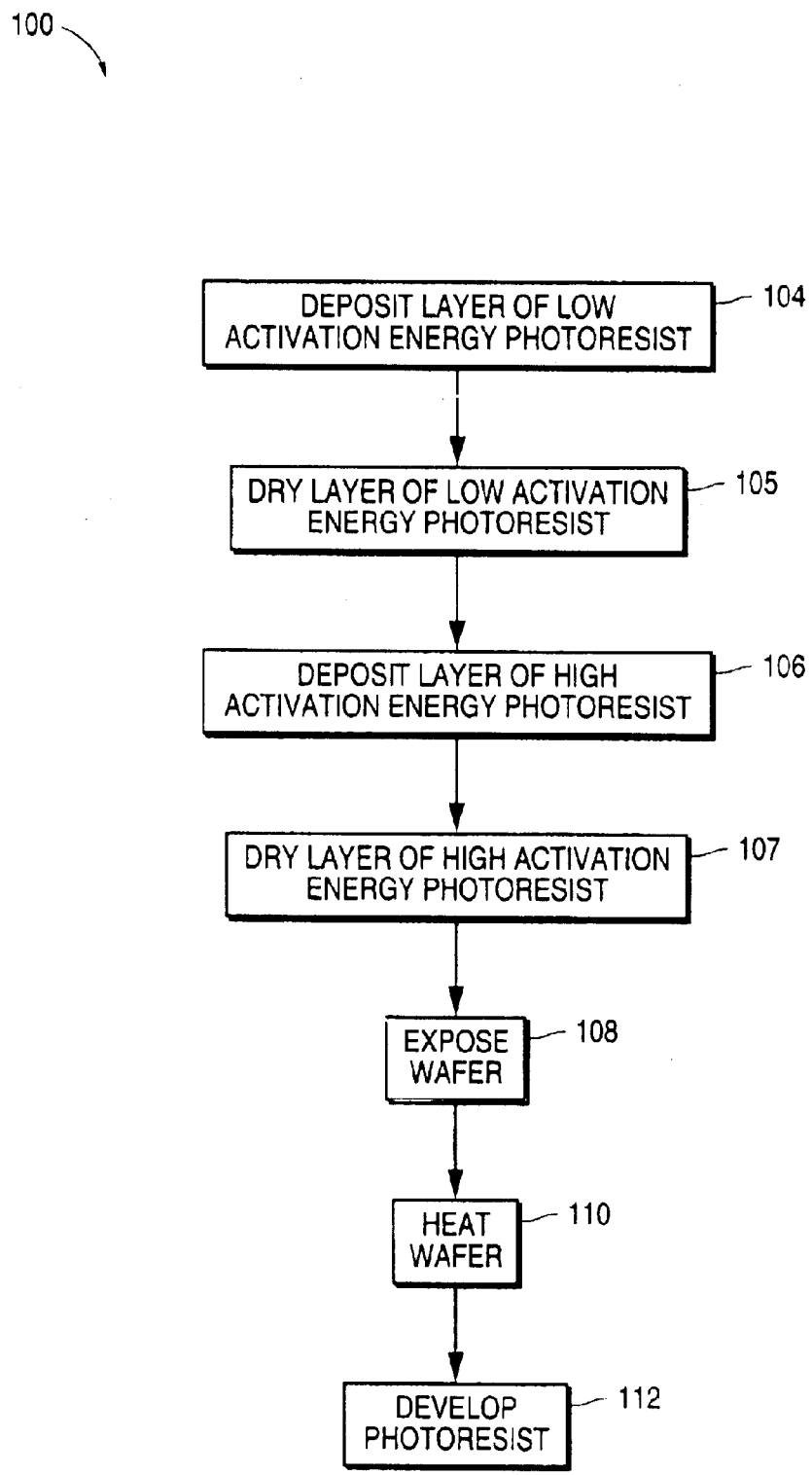
FIG. 1 is a flow chart that illustrates a method for forming a photoresist structure on a semiconductor substrate in accordance with one embodiment of the present invention.

FIG. 1 illustrates a method 100 for forming a photoresist structure on a semiconductor substrate. As shown by step 104 a layer of low activation energy photoresist is deposited over a semiconductor substrate. The term "low activation energy photoresist," as used in the present application includes those photoresists that have a low activation energy of deprotection, and specifically includes deep ultraviolet photoresists that activate at room temperature.

Continuing with step 104, in the present embodiment, the layer of low activation energy photoresist is deposited such that it overlies the layer that is to be patterned. In one embodiment of the present invention, the layer of low activation energy photoresist is deposited over a metal local-interconnect layer that is formed over a semiconductor substrate.

Referring now to step 105, the layer of low activation energy photoresist is dried. In the present embodiment, drying step 105 is performed by placing the semiconductor wafer in an oven and performing a short heating process step.

A layer of high activation energy photoresist is deposited as shown by step 106. The term "high activation energy photoresist," as used in the present application, includes photoresists that have a high activation energy of deprotection, and specifically includes deep ultraviolet photoresists that require temperatures higher than room temperature for deprotection to occur.

Continuing with step 106, in the present embodiment the layer of high activation energy photoresist is deposited directly over the layer of low activation energy photoresist. In one embodiment, the layer of high activation energy photoresist is deposited such that it immediately overlies the layer of low activation energy photoresist.

Referring now to step 107, the layer of high activation energy photoresist is dried. In the present embodiment, drying step 107 is performed by placing the semiconductor wafer in an oven and performing a short heating process step.

Continuing with FIG. 1, an exposure step 108 is performed. In the present embodiment, the exposure step is performed by aligning a mask with the structures formed over the semiconductor substrate. The mask and the semiconductor substrate are then exposed to deep ultraviolet light. Thereby, portions of the layer of high activation energy photoresist are exposed to deep ultraviolet light. The light also penetrates the layer of low activation energy photoresist, exposing portions of the layer of low activation energy photoresist.

The deprotection of the layer of low activation energy photoresist deposited in step 104 occurs at room temperature as soon as acid is generated photochemically by exposure step 108. Therefore airborne base or substrate species have no time to diffuse into the layer of low activation energy photoresist and interfere with the acidolysis reaction. Accordingly, the contaminant airborne base and substrate species do not interfere with the acidolysis reaction. Thereby, swelling defects do not occur in the low activation energy photoresist layer. In addition, the layer of low activation energy photoresist has few, if any, footing and scumming related defects.

Referring now to step 110, a heating step is performed. This heating step or "post-exposure bake" step activates the high activation energy photoresist and deprotects portions of the layer of high activation energy photoresist.

The underlying layer of low activation energy photoresist acts as a contamination barrier, preventing substrate species from migrating into the high activation energy layer. More particularly, the low activation energy layer deposited in step 104 prevents substrate species from entering into the high activation energy layer deposited in step 106 during the time interval between exposure and post-exposure bake. Accordingly, contaminant airborne base and substrate species do not interfere with the acidolysis reaction. Thereby, neutralizaton of acid that can stop deprotection is avoided. As a result, swelling defects do not occur in the high activation energy photoresist layer. In addition, footing-related defects and scumming-related defects are reduced in the high activation energy photoresist layer.

Referring now to step 112, the photoresist is developed. More particularly, a photoresist development step is performed that develops both the layer of high activation energy photoresist deposited in step 104 and the layer of low activation energy photoresist deposited in step 106.

Development step 112 removes portions of the layer of high activation energy photoresist and corresponding portions of the layer of low activation energy photoresist. This results in a photoresist structure that can be used as a masking structure to pattern an underlying layer or layers. In one embodiment, the underlying layer to be patterned is a conductive layer that is a metal local-interconnect layer. However, the masking structure of method 100 could also be used to pattern multiple layers. In addition, the steps of method 100 could be used to pattern a nonconductive layer or layers.

Figure 2:
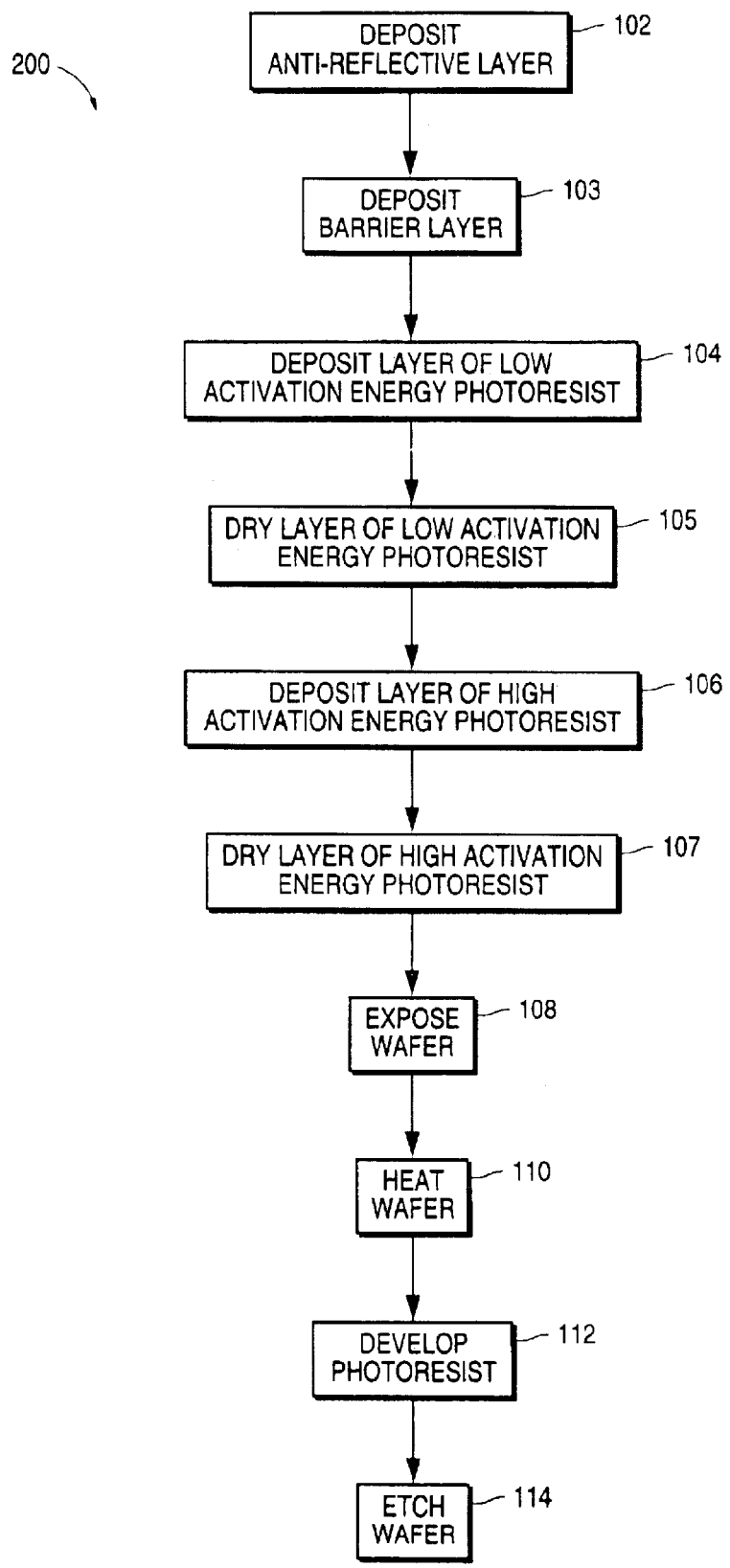
FIG. 2 is a flow chart that illustrates a method for forming a patterned layer on a semiconductor substrate in accordance with one embodiment of the present invention.

FIG. 2 illustrates a method 200 for forming a patterned layer. First, as shown by step 102, an anti-reflective layer is deposited over the layer that is to be patterned. In the present embodiment the anti-reflective layer is an inorganic bottom anti-reflective coating. In one embodiment silicon oxynitride (SiON) film is used as an anti-reflective layer. However, alternatively, other types of anti-reflective materials could also be used.

Figure 3:
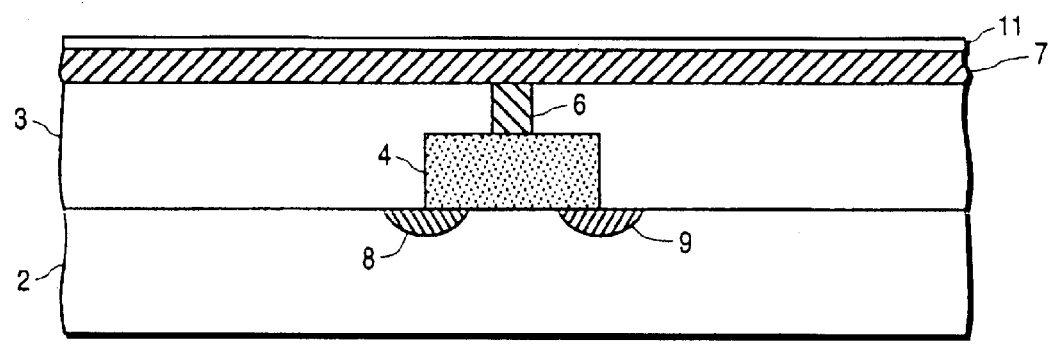
FIG. 3 shows a cross sectional view that illustrates an anti-reflective layer deposited over a semiconductor substrate such that the anti-reflective layer overlies a metal layer, and shows exemplary source, drain, gate, and interconnect structures in accordance with one embodiment of the present invention.

FIGS. 3–10 illustrate an embodiment in which method 200 is used to form a patterned metal local-interconnect layer. Referring now to FIG. 3, in accordance with step 102, anti-reflective layer 11 is deposited over a metal layer 7 that is to be patterned. In one embodiment, anti-reflective layer 11 is a layer of silicon oxynitride having a thickness of 265 Angstroms.

Other structures that are formed over semiconductor substrate 2 include interconnect 6, dielectric layer 3, source 8, drain 9, and gate 4. Metal layer 7 directly overlies Interconnect 6. In one embodiment interconnect 6 is a tungsten (W) plug and conductive layer 7 is a layer of titanium nitride (TiN). Interconnect 6 extends through an opening in dielectric layer 3 and is electrically coupled to metal layer 7. Thereby, interconnect 6 electrically couples conductive layer 7 to gate 4.

As shown by step 103 a barrier layer Is deposited. In the present embodiment, the barrier layer is a layer of silicon dioxide ($SiO_2$). However, alternatively, other materials can be used that are effective for blocking substrate species that cause footing and scumming.

Figure 4:
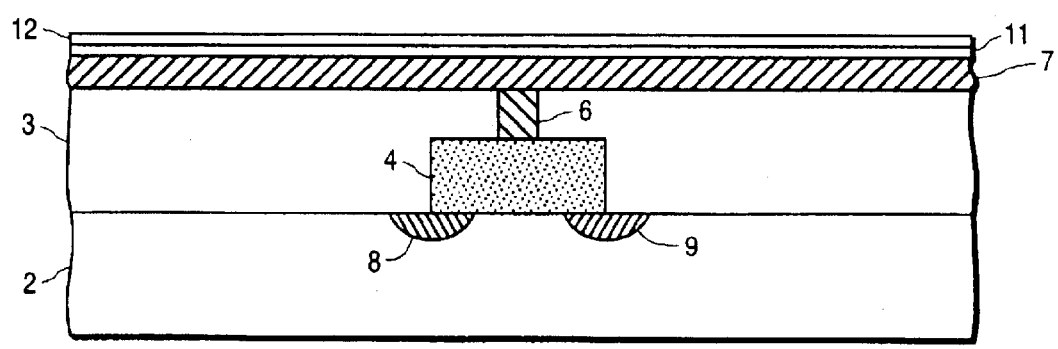
FIG. 4 is a cross sectional view of the structure of FIG. 3 after a silicon dioxide barrier layer has been deposited thereover in accordance with one embodiment of the present invention.

FIG. 4 shows an exemplary barrier layer 12 that is disposed over anti-reflective layer 11. In one embodiment, barrier layer 12 is a layer of silicon dioxide having a thickness of 100 Angstroms. Barrier layer 12 blocks upward migration of contaminants present in anti-reflective layer 11. Also, barrier layer 12 blocks upward movement of contaminants from dielectric layer 3, metal layer 7, and interconnect 6. Though barrier layer 12 blocks much of the contamination, not all of the contamination that causes footing and scumming is blocked. Moreover, the contamination that causes swelling is not blocked.

As shown by step 104 a layer of low activation energy photoresist is deposited over the semiconductor substrate. In one embodiment of the present invention the low activation energy photoresist deposited in step 104 of FIGS. 1–2 comprises a chemically-amplified deep ultraviolet photoresist. In one embodiment, the layer of low activation energy photoresist is a positive photoresist. However, alternatively, a negative photoresist could be used.

In one embodiment the low activation energy photoresist deposited in step 104 of FIGS. 1–2 includes an acetal compound as a backing group. In one embodiment, the low activation energy resist is SPER 402R, commercially available through Shin-Etsu Chemical Co., Ltd., 6-1, Otemachi 2-chome, Chiyoda-ku, Tokyo 100–0004, Japan, having a thickness of approximately 0.1 micrometer.

Figure 5:
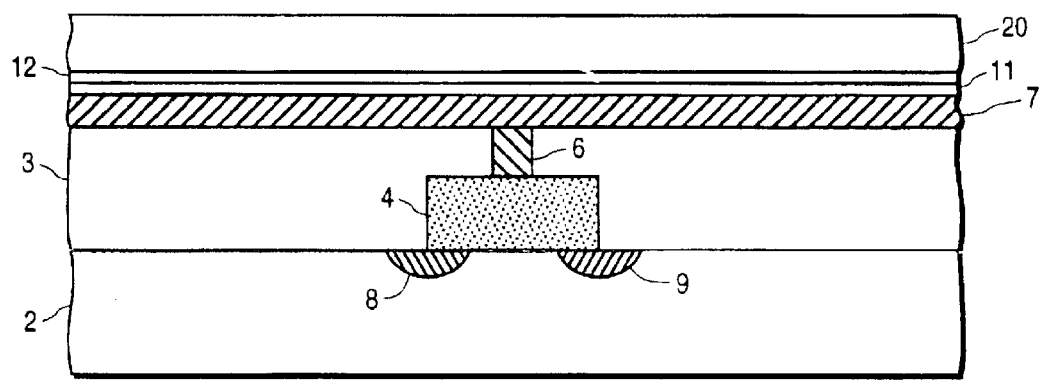
FIG. 5 is a cross sectional view of the structure of FIG. 4 after a layer of low activation energy photoresist has been deposited thereover in accordance with one embodiment of the present invention.

Referring now to FIG. 5, layer of low activation energy photoresist 20 is shown to be deposited over substrate 2 such that it directly overlies barrier layer 12. In the present embodiment, layer of low activation energy photoresist 20 immediately overlies barrier layer 12.

Referring now to step 105, the layer of low activation energy photoresist is dried. In the present embodiment, drying step 105 is performed by placing the semiconductor wafer in an oven and performing a short heating process step. In one embodiment, drying step 105 of FIGS. 1–2 includes placing the wafer in an oven having a temperature of 100 degrees for ninety seconds. Drying step 105 removes excess solvent from the layer of low activation energy photoresist, adjusting the physical and chemical match at the interface between two resists and preventing movement of the layer of low activation energy photoresist during subsequent process steps.

A layer of high activation energy photoresist is deposited as shown by step 106. In the present embodiment the layer of high activation energy photoresist is deposited directly over the layer of low activation energy photoresist.

In the present embodiment, the layer of high activation energy photoresist deposited in step 106 of FIGS. 1–2 is a chemically-amplified deep ultraviolet photoresist. In one embodiment, the layer of high activation energy photoresist deposited in step 106 of FIGS. 1–2 is a positive photoresist. However, alternatively, a negative photoresist could be used.

Continuing with step 106, in one embodiment of the present invention the high activation energy photoresist deposited in step 106 of FIGS. 1–2 is an Environmentally Stable Chemically Amplified Positive (ESCAP) polymer photoresist. In one specific embodiment, a Shipley UV210 photoresist is used.

Figure 6:
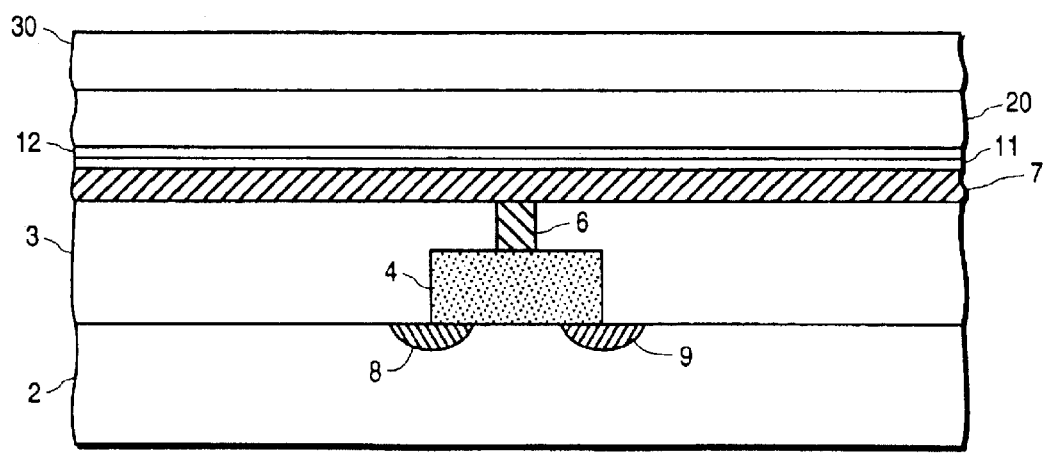
FIG. 6 is a cross sectional view of the structure of FIG. 5 after a layer of high activation energy photoresist has been deposited thereover in accordance with one embodiment of the present invention.

In the embodiment shown in FIG. 6, layer of high activation energy photoresist 30 is shown to be deposited directly over layer of low activation energy photoresist 20. In the present embodiment, layer of high activation energy photoresist 30 immediately overlies layer of low activation energy photoresist 20 and has a thickness of approximately 0.4 micrometers.

Referring now to step 107, the layer of high activation energy photoresist is dried. In the present embodiment, drying step 107 of FIGS. 1–2 includes placing the wafer in an oven having a temperature of 120 degrees for ninety seconds. Thereby, excess solvent is removed from the layer of high activation energy photoresist, adjusting the physical and chemical match at the interface between two resists and preventing movement of the layer of high activation energy photoresist during subsequent process steps.

Continuing with FIG. 1, an exposure step 108 is performed. In the present embodiment, a mask is aligned with the structures formed over the semiconductor substrate and the semiconductor wafer is exposed using deep ultraviolet light. In one embodiment, exposure step 108 of FIGS. 1–2 uses deep ultraviolet light having a wavelength of 248 nanometers. However, it is appreciated that other wavelengths could also be used.

Referring to FIG. 6, exposure step 108 selectively exposes portions of layer of high activation energy photoresist 30 to deep ultraviolet light. This light also penetrates layer of low activation energy photoresist 20. Thereby, portions of layer of low activation energy photoresist 20 are also exposed.

Referring now to step 110, a heating step is performed. This heating step or "post-exposure bake" step of FIGS. 1–2 activates the high activation energy photoresist and deprotects those portions of the high activation energy photoresist that were exposed in step 108. More particularly, the deprotection is a chemical reaction that is carried out by acid generated photochemically by the deep ultraviolet illumination. The deprotection changes the insoluble polymers into compounds that are soluble in the developer.

In one embodiment, heating step 110 of FIGS. 1–2 includes placing the wafer in an oven and heating the wafer for 90 seconds at 120 degrees. However, it is appreciated that heating step 110 will vary depending on the type of high activation energy photoresist used.

In the embodiment shown in FIG. 6 heating step 110 applies sufficient energy to layer of high energy photoresist 30 so as to cause full deprotection of exposed portions of high energy photoresist 30.

Though the use of a positive photoresist is described in steps 108 and 110 of FIGS. 1–2, a negative photoresist could also be used. When a negative high activation energy photoresist is used, those portions of the high activation energy photoresist that were not exposed in step 108 remain developer soluble.

Referring now to step 112, the photoresist is developed. In the present embodiment, development process 112 of FIGS. 1–2 is a wet development process. Alternatively, a dry development process is used. In the present embodiment, the development process is a development process that can be used for developing the high activation energy photoresist that is used (e.g., a development process recommended by the manufacturer of the high activation energy photoresist). It is appreciated that the development process will vary depending on the type of high activation energy photoresist used.

Figure 7:
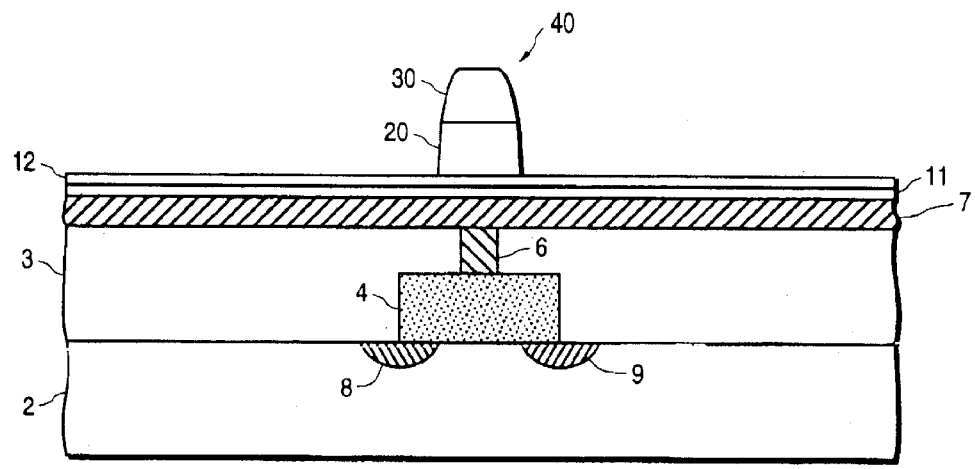
FIG. 7 is a cross sectional view of the structure of FIG. 6 after a development step has been performed in accordance with one embodiment of the present invention.

In the embodiment shown in FIG. 7, development step 112 is shown to have removed portions of layer of low activation energy photoresist 20 and portions of layer of high activation energy photoresist 30, forming photoresist structure 40.

Layer of low activation energy photoresist 20 acts as a contamination barrier, preventing substrate species from migrating into layer of high activation energy photoresist 30. In particular, layer of low activation energy photoresist 20 prevents substrate species from entering into layer of high activation energy photoresist 30 during the time interval between exposure step 108 and heating step 110. Accordingly, contaminant airborne base and substrate species do not interfere with the acidolysis reaction. Thereby, neutralization of acid that can stop deprotection is avoided. As a result, swelling defects do not occur in layer of high activation energy photoresist 30. In addition, footing-related defects and scumming-related defects are reduced in layer of high activation energy photoresist 30. Therefore, a photoresist structure 40 is obtained that does not have a swelling defect proximate interconnect 6. Also, photoresist structure 40 has reduced footing-related defects and scumming-related defects.

Continuing with FIG. 2, an etch step 114 is performed. In the present embodiment, etch step 114 is a selective etch. Referring now to the embodiment shown in FIG. 8, etch step 114 is a selective etch that does not etch photoresist structure 40. Accordingly, photoresist structure 40 acts as a masking structure. Thereby, etch step 114 selectively removes those portions of metal layer 7 that are exposed, leaving that portion of metal layer 7 that underlies photoresist structure 40. In addition, exposed portions of layers 1112 are removed. Because photoresist structure 40 does not have any swelling defect where it extends over interconnect 6, the resulting patterned metal layer 7 does not have swelling where it extends over interconnect 6.

Figure 8:
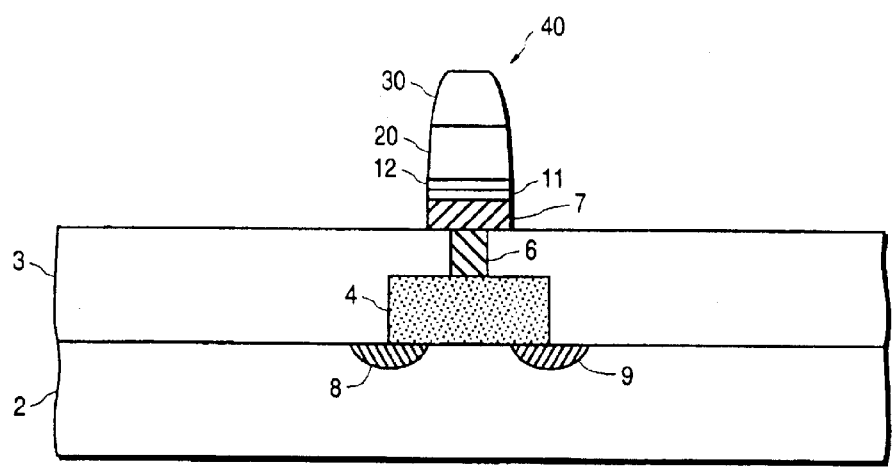
FIG. 8 is a cross sectional view of the structure of FIG. 7 after an etch step has been performed in accordance with one embodiment of the present invention.
Figure 9:
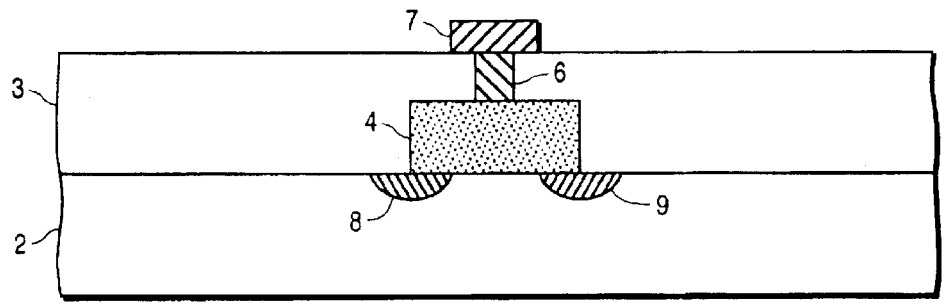
FIG. 9 is a cross sectional view of the structure of FIG. 8 after remaining portions of the high activation energy photoresist layer, the low activation energy photoresist layer, the anti-reflective layer, and the barrier layer have been removed in accordance with one embodiment of the present invention.
Figure 10:
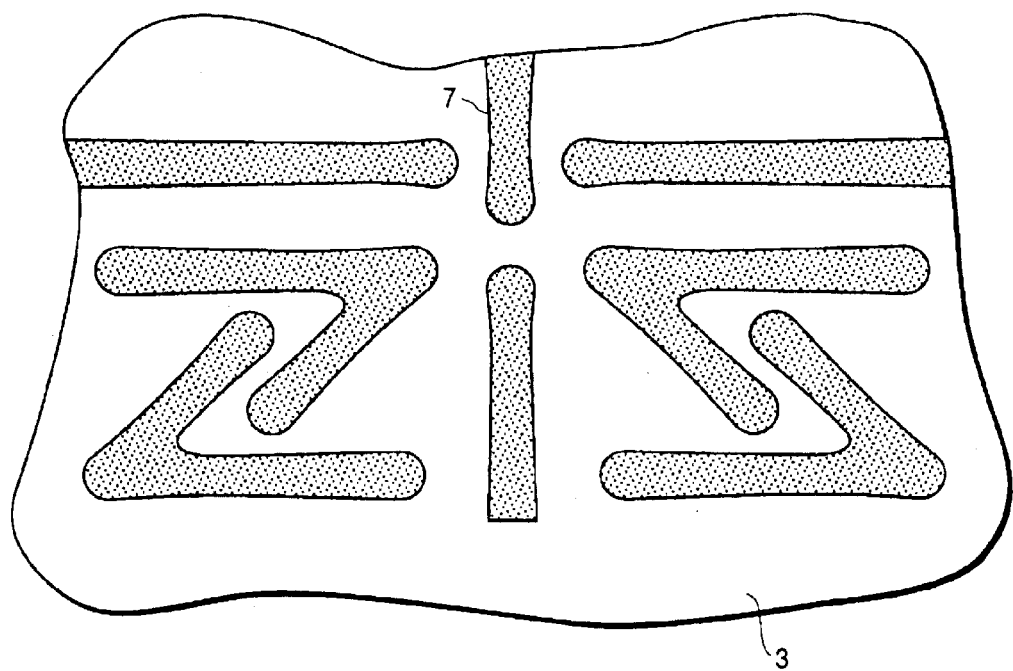
FIG. 10 is a top view of the structure of FIG. 9 in accordance with one embodiment of the present invention.

FIGS. 9–10 show the structure of FIG. 8 after a photoresist strip process has been performed so as to remove remaining portions of high activation energy photoresist layer 30, low activation energy photoresist layer 20, anti-reflective layer 12, and barrier layer 11. This gives a patterned metal layer 7 that does not have swelling proximate interconnect 6.

In the embodiment shown in FIGS. 2–10, metal layer 7 is shown to be a metal-local interconnect layer. However, alternatively, the present invention could be used to pattern other layers. The layer or layers to be patterned can be either conductive or nonconductive and can overlie any of a number of different structures.

Though method 200 of FIG. 2 includes depositon of an anti-reflective layer (step 102) and deposition of a barrier layer (step 103), it is appreciated that these steps are optional. Therefore, a patterned layer could be formed without performing one or both of steps 102–103 of FIG. 2.

In one embodiment of the present invention, steps 105–108, 110 and 112 are the same process steps as are typically used for forming a masking structure using a layer of high activation energy photoresist. In this embodiment, the layer of low activation energy photoresist is deposited over the layer that is to be patterned prior to depositing the layer of high activation energy photoresist such that the layer of high activation energy photoresist immediately overlies the layer of low activation energy photoresist. This gives a photoresist structure that does not have swelling proximate interconnects. In one specific embodiment, Shipley UV210 is used as a high activation energy photoresist and exposure step 108, heating step 110, and development step 112 meet the manufacturer's specifications for subsequent processing.

The preferred embodiment of the present invention is thus described. While the present invention has been described in particular embodiments, it should be appreciated that the present invention should not be construed as limited by such embodiments, but rather construed according to the following claims.

What is claimed is:

1. A method for forming a photoresist structure on a semiconductor substrate comprising:

depositing a layer of low activation energy deep ultraviolet chemically amplified photoresist over said semiconductor substrate;

depositing a layer of high activation energy deep ultraviolet chemically amplified photoresist directly over said layer of low activation energy photoresist;

exposing portions of said layer of high activation energy photoresist to deep ultraviolet light;

heating said layer of high activation energy photoresist; and removing portions of said layer of low activation energy photoresist and portions of said layer of high activation energy photoresist.

2. A method as recited in claim 1 further comprising:

depositing an anti-reflective layer over said semiconductor substrate; and depositing a layer of silicon dioxide over said anti-reflective layer prior to said depositing a layer of low activation energy photoresist over said semiconductor substrate such that said layer of low activation energy photoresist directly overlies said layer of silicon dioxide.

3. A method as recited in claim 1 wherein said layer of low activation energy photoresist comprises an acetal compound.

4. A method as recited in claim 1 wherein said layer of high activation energy photoresist comprises an environmentally stable chemically amplified positive polymer.

5. A method for forming a patterned layer on a semiconductor substrate comprising:

depositing a first layer over a semiconductor substrate;

depositing a layer of low activation energy deep ultraviolet chemically amplified photoresist over said semiconductor substrate such that said layer of low activation energy photoresist overlies said first layer;

depositing a layer of high activation energy deep ultraviolet chemically amplified photoresist over said layer of low activation energy photoresist;

exposing portions of said layer of high activation energy photoresist to deep ultraviolet light;

heating said layer of high activation energy photoresist;

removing portions of said layer of low activation energy photoresist and portions of said layer of high activation energy photoresist; and performing an etch step so as to remove portions of said first layer.

6. A method as recited in claim 5 wherein said first layer comprises a metal layer.

7. A method as recited in claim 5 wherein said layer of low activation energy photoresist comprises an acetal compound.

8. A method as recited in claim 6 wherein said metal layer overlies an interconnect and wherein said metal layer is electrically coupled to said interconnect.

9. A method as recited in claim 6 wherein said layer of high activation energy photoresist comprises an environmentally stable chemically amplified positive polymer.

10. A photoresist structure formed over a semiconductor substrate comprising:

a layer of low activation energy deep ultraviolet chemically amplified photoresist disposed over said semicondutor substrate; and a layer of high activation energy deep ultraviolet chemically amplified photoresist, said layer of high activation energy photoresist disposed immediately over said layer of low activation energy photoresist.

11. A photoresist structure as recited in claim 10 wherein said semiconductor substrate includes an interconnect and a metal-local interconnect layer that overlies said interconnect, said photoresist structure further comprising:

an anti-reflective layer disposed over said metal-local interconnect layer; and a layer silicon dioxide disposed over said anti-reflective layer, said layer of low activation energy photoresist directly overlying said layer of silicon dioxide.

* * * * *

UNITED STATES PATENT AND TRADEMARK OFFICE
CERTIFICATE OF CORRECTION

PATENT NO. : 6,797,456 B1
DATED : September 28, 2004
INVENTOR(S) : Yiming Gu, John L. Sturtevant and Anqing Zhang It is certified that error appears in the above-identified patent and that said Letters Patent is hereby corrected as shown below:

Title page,
Item [75], Inventor, change "Anging Zhang" to -- Anqing Zhang --.

Column 3,
Line 34, change "Invention" to -- invention --.
Line 34, change "However, It" to -- However, it --.

Column 7,
Line 52, change "layers 1112" to -- layers 11-12 --.

Signed and Sealed this

Fifteenth Day of February, 2005

JON W. DUDAS
*Director of the United States Patent and Trademark Office*